United States Patent [19]

Gang

[11] 4,180,769
[45] Dec. 25, 1979

[54] SUPERCONDUCTING SOLENOID WITH COMPENSATION FOR AXIAL GRADIENTS

[75] Inventor: Robert E. Gang, Sunnyvale, Calif.

[73] Assignee: Varian Associates, Inc., Palo Alto, Calif.

[21] Appl. No.: 879,298

[22] Filed: Feb. 21, 1978

[51] Int. Cl.$^2$ .......................................... G01R 33/08
[52] U.S. Cl. ..................................................... 324/319
[58] Field of Search ......... 324/0.5 R, 0.5 MA, 0.5 H, 324/0.5 AH

[56] References Cited

U.S. PATENT DOCUMENTS

| | | | |
|---|---|---|---|
| 3,287,630 | 11/1966 | Gang | 324/0.5 H |
| 3,419,904 | 12/1968 | Weaver et al. | 324/0.5 H |
| 3,564,398 | 2/1971 | Nelson | 324/0.5 H |
| 3,569,823 | 3/1971 | Golay | 324/0.5 H |
| 3,577,067 | 5/1971 | Weaver, Jr. | 335/216 |

*Primary Examiner*—M. Tokar
*Attorney, Agent, or Firm*—Stanley Z. Cole; Edward H. Berkowitz

[57] ABSTRACT

A superconducting solenoid with compensation for axial gradients of orders 1 through 7 is formed of a superconducting wire having a rectangular cross-section. The wire is wound as a solenoid having a longitudinal axis and multiple helical layers, adjacent ones of which are pitched in opposite directions. The solenoid includes a main winding portion, as well as auxiliary and supplemental winding portions at each end of the main winding portion. The auxiliary and supplemental winding portions, respectively on the interior and exterior cylindrical faces of the main windng portion, compensate for the second and fourth order gradients. A further winding portion in the center of the main winding portion, on the interior cylindrical face thereof, compensates for sixth order axial gradients. The odd order gradients are compensated because each of the winding portions have approximately an equal number of turns on opposite sides of a centrally located transverse axis of the main winding portion.

14 Claims, 3 Drawing Figures

SUPERCONDUCTING SOLENOID WITH COMPENSATION FOR AXIAL GRADIENTS

FIELD OF THE INVENTION

The present invention relates generally to superconducting solenoids and more particularly to a superconducting solenoid having a main winding portion and a further winding portion that is centrally located relative to the main winding portion to compensate for sixth order axial gradients of the magnetic field of the main winding portion.

BACKGROUND OF THE INVENTION

In nuclear magnetic resonance (NMR) spectrometers, it is desired to produce a homogeneous field in a sample to be analyzed. Typically, the sample is located in a vial that is inserted into a magnetic field desirably having uniform characteristics throughout the length of the sample. In some spectrometers, the magnetic field is provided by a superconducting, solenoid coil having an interior into which the vial and sample are placed. Numerous winding arrangements have been employed in attempts to enable the field within the interior of the solenoid to be uniform along the solenoid longitudinal axis.

Exemplary of the prior art showing apparatus for enabling substantially homogeneous magnetic fields to be produced in NMR superconducting, solenoid coils are the commonly assigned U.S. Pat. Nos. to Gang 3,287,630, Werner et al 3,419,904, Nelson 3,564,398 and Werner 3,577,067. In the Gang patent, correction for first, second and third order axial field gradients is obtained by utilizing correcting shim coils that are mounted in proximity to the exterior cylindrical surface of a solenoid, in combination with a coil assembly mounted inside of the main solenoid winding in very close proximity to the sample holding vial. The coil assembly includes four groups of coaxially aligned coils that provide first order, second and third order corrections for linear gradients of the main coil. To compensate for variations of the magnetic field of the main coil relative to the transverse axis of that coil, there are provided circular coils having longitudinal axes aligned with the transverse axes of the main coil. Each set of coils in this prior art device is supplied with a separate, independently controlled current, so that the different coil sets are generally energized with differing currents from a DC power supply source.

In the coil disclosed in the Nelson patent, a plurality of correcting coils are longitudinally positioned at different regions inside of the main coil so that the individual correcting coils have spatial independence. In the Werner and Weaver et al patents, as in the Nelson patent, different currents are supplied to the individual coils to achieve the desired corrections.

To facilitate energization of superconducting coils, it is desired for all of the coil segments to be supplied with the same series current. It is difficult to supply different windings or winding portions of the coil with different currents in a superconducting magnet system because the coil is in a relatively inaccessible position relative to the power supply, i.e., in the interior of a Dewar maintained at a cryogenic temperature on the order of 4.2° K. Also, it is desirable to minimize the number of leads connecting the coil to the environment outside of the Dewar to reduce the coupling of heat from outside of the Dewar to the coil.

Other disadvantages were associated with the prior art structures. In particular, they usually required empirical studies to determine the correct current to be supplied to each of the coils. While some of the prior art coils corrected for inhomogeneities of the longitudinal magnetic field, through fifth order axial gradients, it is necessary for certain purposes, to correct for axial gradients as high as the seventh order.

BRIEF DESCRIPTION OF THE INVENTION

It is now known that superconducting wire having a rectangular cross-section, formed of copper, surrounding a relatively small diameter superconducting core or strand enables helical windings to have uniform pitch in adjacent layers. This is in contrast to a non-uniform pitch that exists with superconducting wire having a round cross-section. Because of the uniform pitch of adjacent helical layers, substantial spiral and radial magnetic field gradients do not occur in the interior of the solenoid coil. With the elimination of the spiral and radial gradients, it was realized that there were substantial sixth and seventh order longitudinal, i.e., axial, gradients in the magnetic field of the super-conducting solenoid.

The sixth and seventh order gradients are eliminated with the invention by winding the rectangular cross-section superconducting wire into a main solenoid winding portion having $N_1$ turns, a pair of auxiliary solenoid winding portions having $N_2$ turns, a pair of supplemental solenoid winding portions having $N_3$ turns and a further winding portion having $N_4$ turns, where $N_1$ is greater than $N_2$, $N_2$ is greater than $N_3$, and $N_3$ is greater than $N_4$. The main solenoid winding portion includes a longitudinal axis, a transverse, centrally located axis, as well as first and second opposite end portions and a central portion. The first and second auxiliary solenoid winding portions are coaxial with the main winding portion and have ends respectively aligned with the two end portions of the main winding portion. The auxiliary winding portions are wound, connected and positioned to increase the magnetic field of the main winding portion, a result that is preferably achieved by winding the auxiliary portions on the exterior, cylindrical surface of the main winding portion. The two supplemental winding portions are also coaxial with the main winding portion and have their ends aligned with the two end portions of the main winding portion. The supplemental winding portions are wound, positioned and connected to increase the magnetic field of the main winding portion in the vicinity of the end portions, a result that is preferably achieved by winding the supplemental winding portions on the interior, cylindrical face of the main winding portion. The auxiliary and supplemental winding portions are positioned and wound to compensate for second and fourth order axial gradients of the main winding portion.

To compensate for sixth order axial gradients, the further winding portion is wound coaxially with the main winding portion and is aligned with the center portion thereof. The further winding portion has an axial extent such that no part of it is aligned with any part of the auxiliary winding portion or the supplemental winding portion. The further winding portion is positioned, wound and connected to increase the magnetic field of the main winding portion in the vicinity of the center portion.

To eliminate the odd order gradients, the main and further winding portions are symmetrically located relative to the central transverse axis, and there is symmetry between the auxiliary and supplemental winding portions at opposite ends of the main winding. The symmetrical relations are achieved because: (1) the main and further winding portions have a substantially equal number of turns on opposite sides of the transverse axis, (2) the auxiliary windings at opposite ends of the main winding have approximately the same number of turns, and (3) the supplemental windings at opposite ends of the main winding portion have approximately the same number of turns.

A feature of the invention is that all of the winding portions are wound in series so that the same current flows through all of them. Thereby, the solenoid coil requires only two leads to be initially charged. These two leads extend through a relatively small diameter tube from an exterior environment of the Dewar containing the coil, thereby minimizing heat coupling from the exterior environment to the cryogenic environment in which the superconducting coil is located.

A further feature of the invention is that both terminals of the solenoid coil can be on one side of a bobbin about which the coil is wound, without any cross overs that add to the thickness of the coil. This result is achieved by providing one of the supplemental winding portions, preferably on the inner cylindrical face of the main winding portion, with an odd number of turns and connecting the supplemental and further winding portions to each other via a lead that extends axially through a pair of slots on the outside of the bobbin, along the longitudinal axis of the main winding portion.

It is, accordingly, an object of the present invention to provide a new and improved superconducting solenoid coil.

Another object in the invention is to provide a superconducting solenoid coil having compensation for axial gradients of a main coil for magnetic field variations of orders 1–7.

A further object of the invention is to provide a new and improved superconducting solenoid coil that is easily charged because all winding portions thereof are connected in series so that a single charging current flows through them.

An additional object of the invention is to provide a new and improved superconducting coil that does not require empirical analysis to determine the magnitude of charging currents which must be supplied to different coil sections.

Yet another object of the invention is to provide a new and improved superconducting coil in which the leads for energization current are coupled to one face of the coil.

The above and further objects and features of the invention will become apparent from the following description of one specific embodiment of the invention as disclosed in the accompanying drawings.

DETAILED DESCRIPTION OF THE DRAWING

Figure 1:
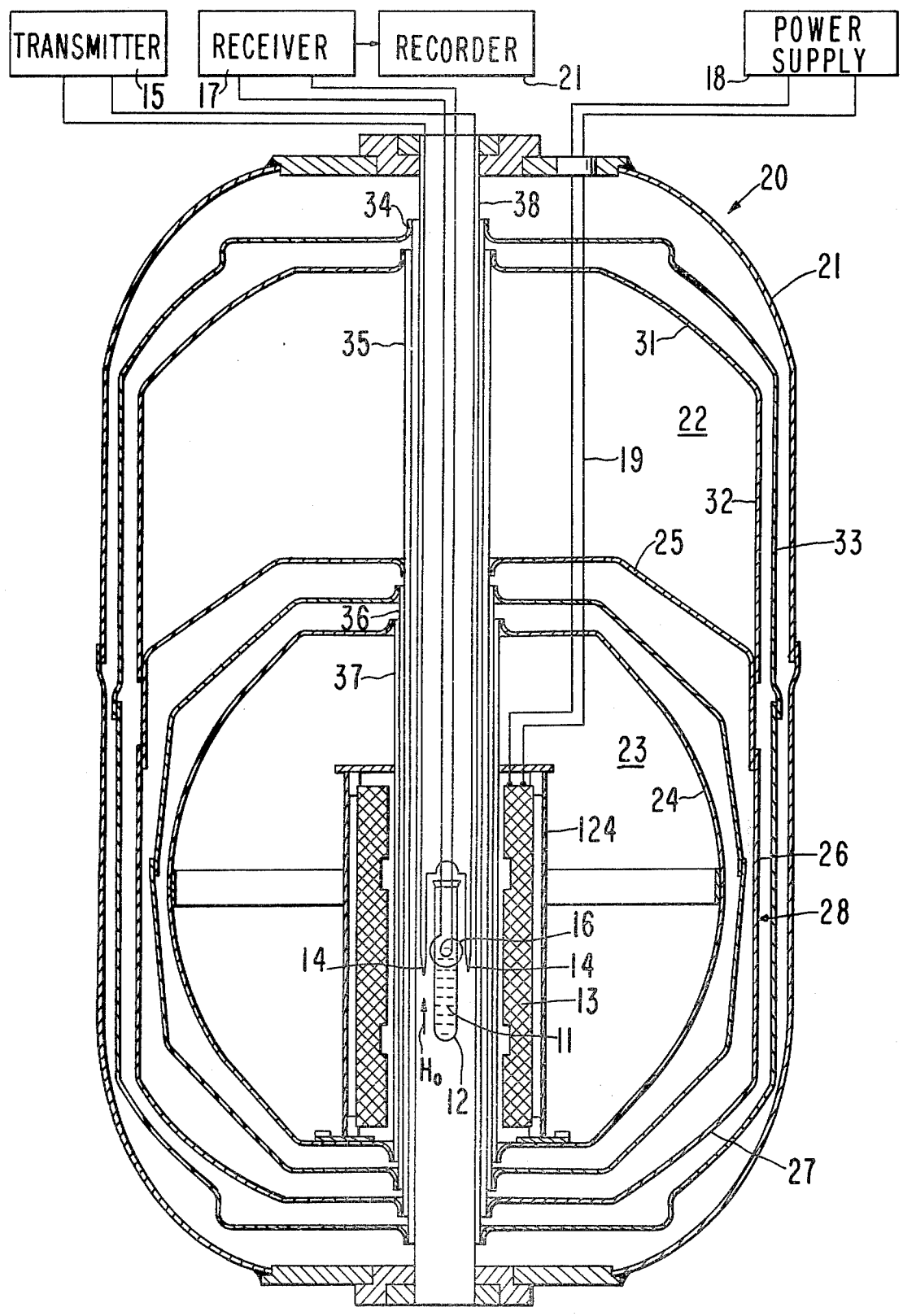
FIG. 1 is a cross-sectional view of an NMR spectrometer including a superconducting coil of the present invention, in combination with apparatus for enabling the spectrometer to be used.

Reference is now made to FIG. 1 of the drawing wherein there is illustrated a nuclear magnetic resonance spectrometer utilizing a superconducting magnet system. Sample 11 to be investigated for NMR characteristics is disposed within vial 12, located within a homogeneous magnetic field $H_0$ produced by superconducting solenoid 13 in its interior or central core. A pair of transmitter coils 14 straddle vial 12 in the core of solenoid 13 so that the axes of coils 14 are substantially aligned with each other and are at right angles to the field $H_0$. Transmitter coils 14 respond to rf energy derived by rf transmitter 15 to apply rf energy to sample 11. At right angles to the directions of the axes of coils 14 and field $H_0$ is the axis of receiver coil 16, positioned in the core of solenoid 11, proximate vial 12 so coil 16 derives a signal indicative of the NMR properties of sample 11. Receiver coil 16 supplies an input signal to radio receiver 17.

Superconducting coil 13 is energized by DC power supply 18 via leads 19 that extend through a relatively narrow sleeve in Dewar 12; leads 19 are schematically shown as extending through the Dewar and are connected to energize solenoid 13. In response to energization current from power supply 18, coil 13 generates the relatively high intensity, homogeneous DC magnetic field $H_0$ that extends throughout the volume of sample 11. Typically, an energization current of 50–60 amperes flows in superconductor solenoid 13 to produce a DC magnetic field $H_0$ on the order of 100 kilogauss. As is conventional in modern NMR spectrometers employing superconducting solenoids, once solenoid 13 has been energized by power supply 18, it is disconnected from the power supply, except under unusual circumstances.

To achieve sweeping of the properties of sample 11, transmitter 15 supplies pulses of rf energy to coil 14, and these pulses are selectively absorbed by the sample. Pickup coil 16 transduces the energy that is re-radiated from sample 11 and supplies a signal spectrum to receiver 17. Receiver 17 includes Fourier transform calculating apparatus that enables a trace of the NMR characteristics of sample 11 to be derived and displayed by X-Y recorder 21.

Coil 13 is maintained at cryogenic, liquid helium temperatures on the order of 4.2 degrees K. In a preferred embodiment, this cryogenic temperature of solenoid coil 13 is established with a Dewar 20 having an exterior, aluminum shell 21 in which is located an aluminum can 22 that holds liquid nitrogen at approximately 77 degrees K. Below liquid nitrogen can 22 is a further can 23, filled with liquid helium. Can 23 surrounds cylinder 24 in which superconducting coil 13 is located. An evacuated space, typically at a vacuum of about $10^{-5}$ torr, exists between wall 25 of can 23 and floor 25 of can 21, as well as between wall 24 and sidewall 26 and floor 27 of aluminum thermal shield 28. In the evacuated space immediately outside of can 23 is a further aluminum thermal shield 29. A further evacuated space exists between roof 31 and sidewall 32 of can 22, as well as between wall 26 and floor 27 of shield 28 and shell 21. In this further evacuated space is located another thermal shield 33. To assist in minimizing the flow of heat from the exterior of Dewar 20 to superconducting coil 13, shield 33, roof 31, floor 25, and shield 29 are respectively provided with sleeves 34, 35 and 36, all of which are concentric with bore 37 that extends through the interior of can 23. Bore 37 is coaxial with sleeve 38 that extends between diametric ends of Dewar 20. Coil 13 is coaxial with sleeves 34–36 so that the magnetic field H also extends in the same direction as the common longitudinal axis of the sleeves.

In accordance with the present invention, solenoid 13 produces a very homogeneous magnetic field $H_0$ throughout sample 11. Solenoid coil 13 can be considered as an eighth order coil, i.e., the coil has flat magnetic field characteristics along its longitudinal axis for polynominal orders 1 through 7. In addition, magnetic field $H_0$ has virtually no spiral nor radial components in the region where sample 11 is located, i.e., virtually all components of the field passing through sample 11 are aligned with the longitudinal axis of solenoid 13.

To these ends, solenoid coil 13 includes a main winding portion 41, a pair of auxiliary winding portions 42 and 43, a pair of supplemental winding portions 44 and 45, and a further winding portion 46. Each of winding portions 41–46 is coaxial with longitudinal axis 47 of coil 13. All of winding portions 41–46 are wound on a cylindrical, non magnetic bobbin 48 and are connected in series with each other so that coil 13 can be energized by current flowing through leads 49 and 50 that extend through a common face 61, at one end of bobbin 48.

All of winding portions 41–46 are wound from superconducting wire having a rectangular cross-section, as disclosed in the copending application of George D. Kneip, Jr., entitled "NMR Spectrometer with Superconducting Coil Having Rectangular Cross-Section Wire," U.S. Ser. No. 879,291, commonly assigned with the present application. Preferably, the superconducting wire has a monofilament configuration including a core of Niobium-Titanium alloy wire having a circular cross-section surrounded by a copper sheath with a rectangular cross-section. Typically, the rectangle has a base wih a length of 0.016 inches and a height of 0.013 inches; the core has a diameter of 0.01 inches in these circumstances. It is to be understood, however, that rectangular cross-section superconducting wire having other cross-sectional dimensions can be employed, as long as the cross-section of the superconductor is small enough to enable the magnetic field which is produced in response to the current flowing through the superconductor to have a uniform position relative to the cross-section of the wire.

Each of winding portions 41–45 is wound as a plurality of helical layers, each of which is concentric with axis 47. Immediately adjacent helical layers are wound so that they have oppositely directed pitches. Between adjacent helical layers is a thin dielectric sheath (not shown) of Mylar that electrically insulates adjacent layers from each other even if the superconducting cores of adjacent layers go normal, i.e., no longer remain superconducting. During superconducting operation, the impedance of the copper sheath relative to the impedance of the superconducting core is so great that the copper appears to be similar to an open circuit. If the superconducting core goes normal, the copper sheath provides a shunt path for the portion of the core that has gone normal, thereby tending to avoid the possibility of the entire coil going normal if only a small segment thereof goes normal.

Because of the rectangular cross-section of the superconducting wire, adjacent oppositely wound layers of solenoid coil 13 are true helices, having a constant pitch throughout their lengths. Adjacent faces of adjacent helical layers substantially abut against each other, being separated from each other solely by the dielectric sheath. Each abutting layer has a true cylindrical outer perimeter of virtually constant radius, in contrast to the varying radius of a helix formed of circular cross-section wire.

The superconducting wire is wound so that adjacent, orthogonally extending faces thereof are arranged so that the shorter face is at right angles to longitudinal axis 47 and the longer face of the wire extends parallel to axis 47. By arranging the faces of the rectangular cross-section of superconducting wire in this manner, the tendency for adjacent turns of a helical layer to sag to the side of the previously wound turn is substantially obviated.

If main winding portion 41 were the only winding forming solenoid 13, the magnetic field in the interior of the winding, where sample 11 is located, would have variations that are spatially related in accordance with:

$$H_0 = a + bz + cz^2 + dz^3 + ez^4 + fz^5 + gz^6 + hz^7 + iz^8 + \ldots$$

where:
$H_0$ is the magnetic field in the interior of the solenoid,
z is the distance along longitudinal axis 47 from central transverse axis 53, and
a, b, c, d, e, f, g, h and i are constants.

Constants a–i generally have decreasing magnitudes so that the magnetic field gradients along axis 47 for the eight order and above usually have negligible influence on the longitudinal field gradients within the central portion of the bore of solenoid 13.

In accordance with the present invention, winding portions 42–46 are arranged so that the magnitudes of the coefficients b–h are zero and the magnetic field within solenoid 13 can be represented as $H_0 = a + z^8 + \ldots$ Because i and the other higher order of coefficients have relatively small values, it is thus seen that an extremely uniform magnetic field gradient is produced within the core of solenoid 13.

To these ends, auxiliary windings 42, 43, 44, 45 and 46 establish a magnetic field that adds to the magnetic field of main winding portion 41. Winding portions 42–45 eliminate the second and fourth order components, i.e., cause the values of c and e in the equation to be zero, while further winding portion 46 eliminates the sixth order effect (the presence of which requires trim of winding portions 42 through 45), and causes coefficient g in the equation to assume a zero value. Winding portions 41–46 are symmetrically wound relative to central transverse axis 53 to eliminate the odd order components, i.e., to cause the values of the coefficients b, d, f, and i to be zero. Symmetry occurs because the number of windings in main and further winding portions 41 and 46 are equal on opposite sides of axis 53 and because winding portions 42 and 43 have a substantially equal number of turns, and because winding portions 44 and 45 have a substantially equal number of turns.

The magnetic field produced by main winding portion 41 exceeds the combined magnetic fields of all fields produced by the other winding portions 42–46; the combined magnetic fields produced by auxiliary winding portions 42 and 43 exceed the combined magnetic fields produced by supplemental winding portions 44 and 45; and the magnetic field produced by winding portion 46 is less than the magnetic field produced by any of the other winding portions 41–45. To this end, the ampere turns of the winding portions are related by:

$$N_1I_1 > N_2I_2 > N_3I_3 > N_4I_4,$$

where $N_1$ = number of turns of main winding portion 41
$N_2$ = combined number of turns of auxiliary winding portions 42 and 43
$N_3$ = combined number of turns of auxiliary supplemental winding portions 44 and 45
$N_4$ = number of turns of the further winding portion 46
$I_1$ = current supplied to main winding portion 41
$I_2$ = current supplied to both auxiliary winding portions 42 and 43
$I_3$ = current supplied to both supplemental winding portions 44 and 45
$I_4$ = current supplied to further winding portion 46.

Because winding portions 41-46 are connected in series, $$I_1 = I_2 = I_3 = I_4,$$

whereby $$N_1 > N_2 > N_3 > N_4.$$

Auxiliary winding portions 42 and 43 are wound on the exterior, cylindrical surface of main winding portion 41 and extend a substantial length along the longitudinal axis. Supplemental winding portions 44 and 45 are wound on the inside of interior, cylindrical face of main winding portion 41. Winding portions 42–45 are aligned with what may be termed as end portions of the main winding portion 41. Supplemental winding portions 44 and 45, however, have an axial extent less than the axial extent of supplemental winding portions 42 and 43 to assist in reducing the sixth order magnetic field gradient. A first end face 71 of winding portion 41 is aligned with first end faces 72 and 73 of winding portions 42 and 44, while the second end face 74 of winding portion 41 is aligned with first end faces 75 and 76 of winding portions 43 and 45. The second end faces 77 and 78 of winding portions 44 and 45 are more remote from transverse, central axis 53 than are the second end faces 79 and 80 of winding portions 42 and 43. Further winding portion 43 is positioned so that it is on the interior wall of main winding portion 41. In one preferred embodiment, to achieve an eighth order solenoid coil, each of winding portions 42 and 43 included 10 layers and had an axial extent of 26.68% of the length of winding portion 41, each of winding portions 44 and 45 included 5 layers and had an axial extent of 23.58% of the length of main winding portion 41, and further winding portion 46 included a single layer and had an axial extent of 37.37% relative to the length of main winding portion 41.

To enable leads 49 and 50 to be brought through end plate 61 of bobbin 48, without having any cross overs in the coil winding that add to the coil thickness, and to enable the several winding portions to be connected in series with each other so that only a pair of leads need be provided, the winding portions are formed as follows. Initially, an odd number (e.g., five) of helical layers are wound about a cylindrical bobbin portion 51 to form winding portion 44. The last turn of winding portion 44 is on the outermost layer of the winding portion 44, adjacent second face 79. The wire is then pulled radially until it substantially intersects longitudinal axis 47 and thence is then pulled away from plate 61 through tube 52 that extends longitudinally through bobbin 48 on axis 47. Thence, the wire is pulled radially outwardly to form the further winding portion 46. From the last turn of winding portion 46, the wire is pulled radially inwardly to a further tube 83 that extends longitudinally through bobbin 48 on axis 47. The wire is then pulled through tube 83 away from plate 51 and thence is pulled radially outward and winding portion 45 is wound about cylindrical bobbin segment 54. When winding portion 45 is completed, the last turn is at face 76 on the outermost layer of winding portion 45. Main winding portion 41 is then wound as an odd number of helical layers so that the last turn of winding portion 41 is at face 71, on the outermost layer of winding portion 41.

Figure 2:
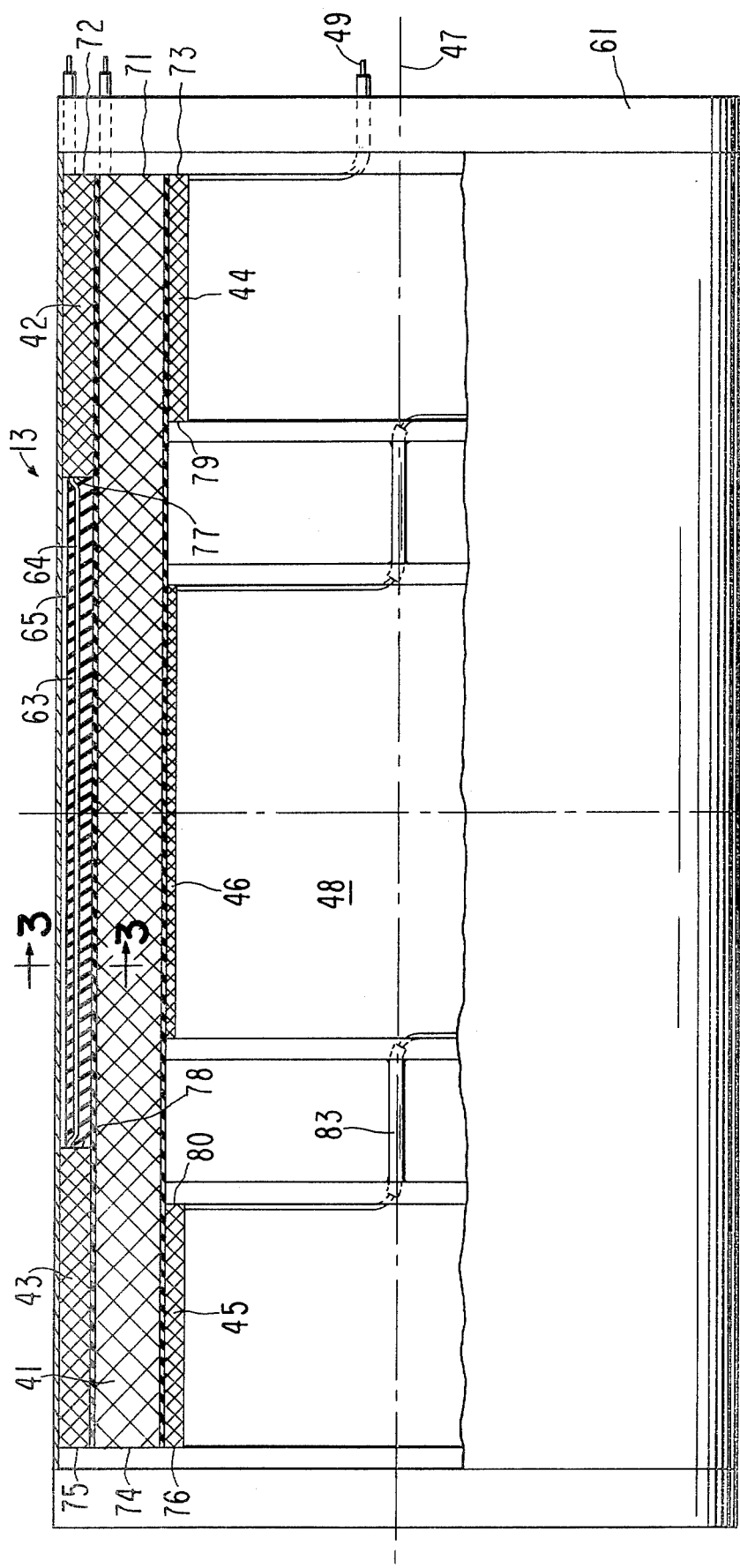
FIG. 2 is a partial cross-sectional view of a superconducting coil in accordance with a preferred embodiment of the invention.
Figure 3:
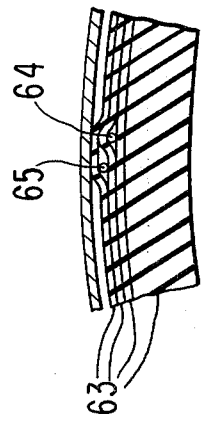
FIG. 3 is a view taken along the line 3—3 of FIG. 2.

After winding portion 41 has been completed, winding portions 42 and 43 are wound. In the finished coil, each of winding portions 42 and 43 includes an even number of layers. However, when winding portion 42 is initially wound, it includes one less layer than its total number of layers. The next to last layer of winding portion 42 is completed at face 77. Then the wire is pulled, as lead 64, longitudinally parallel to axis 47, from winding segment 42 to the innermost layer of winding portion 43 over previously deposited layers 63 of dielectric tape, as illustrated in FIGS. 2 and 3. Winding portion 43 is then wound as a helix including an even number of layers, so that the last turn of winding portion 43 is on the outer layer of the winding portion, at face 78. The wire is then again pulled, as lead 65, longitudinally parallel to axis 47 across layers 63 to winding portion 42. Then, the last layer of winding portion 42 is wound and the wire is brought through an appropriate bore in plate 61.

It is to be understood that many changes can be made in the specifically described embodiment without departing from the true spirit and scope of the invention and that the invention is to be determined from the scope of the following claims, and not limited to the specifically described embodiment.

What is claimed is:

1. A superconducting solenoid coil having compensation for axial gradients of orders 1–7 comprising
a superconducting wire, said wire being wound as a solenoid having a longitudinal axis and multiple helical layers, adjacent ones of said layers having faces that substantially abut against each other, and being pitched in opposite directions,
said solenoid coil including:
a main solenoid winding portion having a longitudinal axis, a transverse centrally located axis, first and second opposite end portions, and a central portion, said main winding portion including a substantially equal number of turns on opposite sides of the transverse axis and producing a longitudinal magnetic field within the interior of the solenoid,
first and second auxiliary solenoid winding portions coaxial with the main winding portion, said first and second auxiliary portions being substantially aligned with the first and second end portions of the main winding portion, said auxiliary winding portions being wound, connected and positioned to increase the magnetic field of the main winding portion in the vicinity of the end portions, said first and second auxiliary winding portions having substantially the same number of turns and being positioned along the longitudinal axis at approximately equal distances from the transverse axis;

first and second supplemental winding portions coaxial with the main winding portion, said first and second supplemental winding portions being respectively and substantially aligned with the first and second end portions of the main winding portion, said supplemental winding portions being wound, positioned and connected to increase the magnetic field of the main winding portion in the vicinity of the end portions, said first and second supplemental winding portions having substantially the same number of turns and being positioned along the longitudinal axis at approximately equal distances from the transverse axis;

the auxiliary and supplemental winding portions compensating for the second and fourth order gradients of the main winding portion;

and a further winding portion coaxial with the main winding portion and aligned with the central portion of the main winding portion, said further winding portion having an axial extent such that no part thereof is aligned with any part of the auxiliary winding portion or the supplemental winding portion, said further winding portion having a substantially equal number of turns on opposite sides of the transverse axis, said further winding portion being positioned, wound and connected to increase the magnetic field of the main winding portion in the vicinity of the center portion of the main winding portion.

2. The coil of claim 1 wherein the winding portions are wound and excited with current from an external source so that $N_1I_1 > N_2I_2 > N_3I_3 > N_4I_4$, where $N_1$ = number of turns of the main winding portion
$N_2$ = combined number of turns of both auxiliary winding portions
$N_3$ = combined number of turns of both supplemental winding portions
$N_4$ = number of turns of the further winding portion
$I_1$ = current supplied to the main winding portion
$I_2$ = current supplied to both auxiliary winding portions
$I_3$ = current supplied to both supplemental winding portions
$I_4$ = current supplied to the further winding portion.

3. The coil of claim 1 wherein all of said winding portions are wound in series so the same current flows through all of them.

4. The coil of 3 wherein the winding portions are wound so that $N_1 > N_2 > N_3 > N_4$, where:

$N_1$ = number of turns of the main winding portion
$N_2$ = combined number of turns of both auxiliary winding portions
$N_3$ = combined number of turns of both supplemental winding portions
$N_4$ = number of turns of the further winding portion.

5. The coil of claim 3 wherein the main winding portion includes interior and exterior cylindrical surfaces, the further and supplemental winding portions being positioned inside of the interior surface, the auxiliary winding portions being positioned outside of the exterior surface.

6. The coil of claim 5 wherein the first supplemental winding portion and the first auxiliary winding portion have end faces aligned with a first end face of the main winding portion and second faces remote from the first end face of the main winding portion, the second supplemental winding portion and the second auxiliary winding portion having end faces aligned with a second end face of the main winding portion and second end faces remote from the second end face of the main winding portion, leads for connecting the first supplemental winding portion to the further winding portion and for connecting the further winding portion to the second supplemental winding portion so that current flows from the outermost turn at the second face of the first winding portion to a turn at and adjacent the first end of the further winding portion and from a turn at a second end of the further winding portion to the innermost turn at the second face of the second supplemental winding portion.

7. The coil of claim 6 wherein said leads extend along the longitudinal axis between the supplemental and further windings.

8. The coil of claim 6 wherein each of the supplemental winding portions includes an odd number of layers.

9. The coil of claim 6 wherein the outermost turn at the first face of the second supplemental winding portion is connected to the innermost turn at the second face of the main winding portion, the outermost turn at the first face of the main winding portion being connected to the innermost turn at the first face of the first auxiliary winding portion, a lead for connecting the outermost turn at the second face of the first auxiliary winding portion to the innermost turn at the second face of the second auxiliary winding portion, a second lead for connecting the outermost turn at the second face of the second auxiliary winding portion to the outermost turn at the second face of the first auxiliary winding portion, a lead for connecting the turn at the first face of the first auxiliary winding portion to a first coil terminal adjacent the first face of the main winding portion, a second coil terminal adjacent the first face of the main winding portion connected to the innermost turn at the first face of the supplemental winding portion, both of said supplemental winding portions having an odd number of layers, said main winding portion and both of said auxiliary winding portions having an even number of layers.

10. The coil of claim 1 wherein said superconducting wire has a rectangular cross-section.

11. An NMR spectrometer comprising:
a superconducting solenoid coil having an interior core in which a sample to be tested for NMR spectroscopy is adapted to be placed,
a Dewar for maintaining the superconducting solenoid coil at cryogenic, superconducting temperatures,
an rf source for exciting the sample to a condition of nuclear magnetic resonance,
a pick-up coil for detecting rf energy derived from the sample as a result of excitation of the rf coil, and means for supplying current to the superconducting coil,
said coil being formed of a superconducting wire having a rectangular cross-section, said wire being wound as a solenoid having a longitudinal axis with multiple helical layers, adjacent ones of said layers having faces that substantially abut against each other and being pitched in opposite directions, said solenoid coil including:
a main solenoid winding portion having a longitudinal axis, a transverse, centrally located axis, first and second opposite end portions, and a central portion, said main winding portion including a substantially equal number of turns on opposite sides of the transverse axis and producing a longitudinal magnetic field within the interior of the solenoid, said longitudinal field being supplied to the sample within the interior of the coil;

first and second auxiliary solenoid winding portions coaxial with the main winding portion said first and second auxiliary portions being respectively and substantially aligned with the first and second end portions of the main winding portion, said auxiliary winding portions being wound, connected and positioned to increase the magnetic field of the main winding portion in the vicinity of the end portions, said first and second auxiliary winding portions having substantially the same number of turns and being positioned along the longitudinal axis at approximately equal distances from the transverse axis;

first and second supplemental winding portions coaxial with the main winding portion, said first and second supplemental winding portions being respectively and substantially aligned with the first and second end portions of the main winding portion, said supplemental winding portions having approximately the same number of turns and being positioned along the longitudinal axis at approximately equal distances from the transverse axis, said supplemental winding portion being wound, positioned and connected to decrease the magnetic field of the main winding in the vicinity of the end portions;

said auxiliary and supplemental winding portions being positioned and wound to compensate for second and fourth quarter axial gradients of the main winding portion; and a further winding portion coaxial with the main winding portion and substantially aligned with the center portion of the main winding portion, said further winding portion having an axial extent such that no part thereof is aligned with any part of the auxiliary winding portions or the supplemental winding portions, said further winding portion having a substantially equal number of turns on opposite sides of the transverse axis, said further winding portion being positioned, wound and connected to decrease the magnetic field of the main winding portion in the vicinity of the center portion of the main winding portion.

12. The coil of claim 11 wherein the winding portions are wound and excited with current from an external source so that $N_1 I_1 > N_2 I_2 > N_3 I_3 > N_4 I_4$, where $N_1$ = number of turns of the main winding portion,
$N_2$ = combined number of turns of both auxiliary winding portions,
$N_3$ = combined number of turns of both supplemental winding portions
$N_4$ = number of turns of the further winding portion,
$I_1$ = current supplied to the main winding portion,
$I_2$ = current supplied to both auxiliary winding portions,
$I_3$ = current supplied to both supplemental winding portions,
$I_4$ = current supplied to the further winding portion.

13. The spectrometer of claim 11 wherein all of said winding portions are wound in series so the same current flows through all of them.

14. The coil of claim 13 wherein the winding portions are wound so that $N_1 > N_2 > N_3 > N_4$, where:

$N_1$ = number of turns of the main winding portion,
$N_2$ = combined number of turns of both auxiliary winding portions,
$N_3$ = combined number of turns of both supplemental winding portions,
$N_4$ = number of turns of the further winding portion.

* * * * *